Nov. 4, 1969 R. L. BAILEY ET AL 3,477,032
PARALLELING ACTIVE CIRCUIT ELEMENTS
Filed May 1, 1968
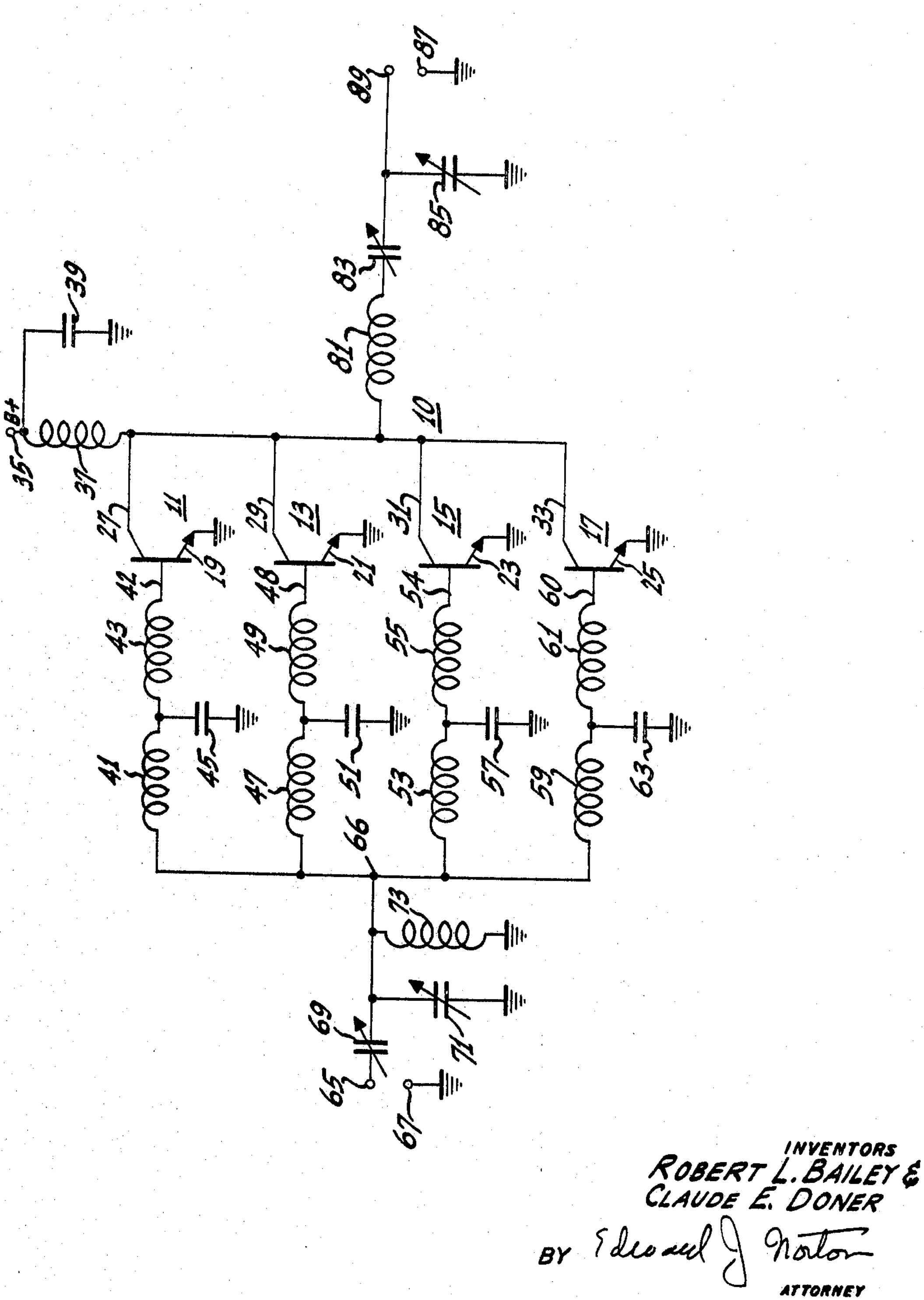
INVENTORS
ROBERT L. BAILEY &
CLAUDE E. DONER
BY Edward J. Norton
ATTORNEY

United States Patent Office 3,477,032

Patented Nov. 4, 1969

3,477,032

PARALLELING ACTIVE CIRCUIT ELEMENTS

Robert Linton Bailey, Leola, and Claude Edward Doner, Lancaster, Pa., assignors to RCA Corporation, a corporation of Delaware

Filed May 1, 1968, Ser. No. 725,709

Int. Cl. H03f *3/68*

U.S. Cl. 330—30 6 Claims

ABSTRACT OF THE DISCLOSURE

The efficient paralleling of power transistors at RF frequencies is achieved by placing a compensating network between the input of each transistor and the paralleling point which minimizes the effect of transistor-to-transistor input variations. The compensating network is a T-section network including series connected inductances in each of the series arms and a capacitor in a shunt arm coupled to the junction of the inductors.

Background of the invention

This invention relates to paralleling active circuit elements and more particularly to a circuit for parallelling transistors so as to minimize the effect of transistor-to-transistor input variations which cause unequal power distribution between the transistors.

High frequency transistors, for example, are generally small in size and have corresponding low power handling capability. To construct a high-power, high-frequency transistor-amplifier circuit, a plurality of transistors need to be combined so that each delivers a portion of the total power to the load. A well known arrangement for accomplishing this combination in a transistor-amplifier is to connect the transistors in parallel with the like terminals of the respective transistors coupled together, operating the paralleled combination as one high power unit. This approach is somewhat like that used in paralleling vacuum tubes. Transistors, however, are unlike vacuum tubes in that they have a relatively low input impedance which is a function of instantaneous signal level and which varies with individual transistors. A paralleled transistor-amplifier will exhibit unequal power distribution among the various transistor devices due to the unequal input impedance. The power dissipated by each device is directly related to the input current drawn by the device and the voltage coupled across the device. A transistor with low base-to-emitter impedance tends to draw more current than one with a high base-to-emitter impedance. This unequal current and voltage distribution across the base-to-emitter causes a correspondingly unequal power distribution, reducing therefore the parallel efficiency of the amplifier, and also in many cases resulting in the destruction of one or more of the devices.

The prior art also describes attempts at efficiently paralleling transistors by the use of hybrid combiners or by the individual tuning to resonance of each transistor with variable circuit components. The use of such prior art structure results in increased circuit complexity, size and high cost.

It is therefore an object of the present invention to provide an improved circuit for connecting semiconductor active elements for high-power, high-efficiency operation.

It is a further object of the present invention to provide a highly efficient transistor paralleling circuit for minimizing the effect of transistor-to-transistor input variations by the use of a compensating network which is low cost and dues not require tuning.

Brief description of the invention

According to the invention, a separate compensating circuit in the form of a T-section network is connected between the input paralleling point and the input of each transistor connected in a parallel circuit arrangement. In the embodiment described, the T-network includes an inductance in the series arm and a capacitance in a shunt arm connected to a point on the inductance. The values of the capacitance and of the inductance between the capacitance and the input of the transistor are chosen such that their reactances are approximately equal at the operating frequency, the ratio therebetween being determined by the desired bandwidth. The value of the remaining inductance in the series arm is determined to provide the desired compromise between bandwidth and paralleling efficiency.

Description of the preferred embodiment

A more detailed description follows in conjunction with the single drawing which is a circuit diagram of a variable RF amplifier employing the principles of the present invention.

Four transistors 11, 13, 15 and 17 are shown coupled in parallel to form the overall parallel connected power amplifier 10. The emitters 19, 21, 23 and 25 of respective transistors 11, 13, 15 and 17 are coupled to ground or reference potential. The collectors 27, 29, 31 and 33 of the respective transistors 11, 13, 15 and 17 are coupled together and to the positive terminal 35 of a source of unidirectional potential through coil 37. A filter capacitor 39 is connected between the terminal 35 and ground. The base-to-emitter input path of transistors 11, 13, 15 and 17 includes a compensating and frequency selection network placed between the input of each of the transistors and the common input paralleling point. The compensating network is comprised of a T-section network including the series connection of a pair of inductors in each series arm and a capacitor coupled between the junction of the inductors and the point of reference potential to form a shunt arm. Inductors 41 and 43 are series connected between the input paralleling point and base 42 of transistor 11, and a capacitor 45 is in the shunt arm. Inductors 47 and 49 are series connected between the input paralleling point and base 48 of transistor 13, and a capacitor 51 is in the shunt arm. Inductors 53 and 55 are series connected between the input paralleling point and base 54 of transistor 15, and a capacitor 57 is in the shunt arm, Inductors 59 and 61 are series connected between the input paralleling point and base 60 of transistor 17, and a capacitor 63 is in the shunt arm. The inductances 43, 49, 55 and 61 are connected in series with the respective capacitances 45, 51, 57 and 63 across the base-emitter paths of the respective transistors 11, 13, 15 and 17. The values of the inductances 43, 49, 55 and 61 and of the capacitances 45, 51, 57 and 63 are chosen so that their reactances in the respective parallel arms are approximately equal at the operating frequency forming in each parallel arm a series resonant circuit. The inductance-to-capacitance ratio is determined to provide the bandwidth desired. Decreasing the ratio lowers the Q causing increased bandwidth.

The values of inductors 41, 47, 53 and 59 are made sufficiently large in combination with inductors 43, 49, 55 and 61 so as to provide isolation of the stages one from another and so as to minimize the effect of the inherent input impedance differences of the individual transistors, thereby controlling both the current distribution and the voltage distribution between the transistors and consequently an unequal power dissipation in the devices upon the application of the input signal to the parallel arrangement.

The input signals from an outside source are applied across terminals 65 and 67. The signals are fed via a series connected variable capacitor 69 and a shunt connected variable capacitor 71 across an RF choke coil 73 connected between the input paralleling point and ground. The input signal is applied to the four transistors 11, 13, 15 and 17 through the compensating and frequency selective T-section network already described in each of the parallel arms. The output of the transistors are fed to a common point and through a common tuned output circuit including inductor 81, series connected variable capacitor 83 and shunt capacitor 85 to output terminal 87 and 89. The capacitors 83 and 85 are variable in order to tune to the desired output frequency.

In an amplifier similar to that described above, 100 percent paralleling efficiency of four transistors was achieved using fixed T-section inductors and capacitors at 400 megacycles. The transistors 11, 13, 15 and 17 in the amplifier were 2N5016 transistors. The elements in the overall circuit had the following approximate values:

Capacitors 45, 51, 57, 63—12 picofarads
Capacitor 69 (variable)—0.9 to 7 picofarads
Capacitor 71 (variable)—1 to 20 picofarads
Capacitor 83 (variable)—8 to 60 picofarads
Capacitor 85 (variable)—1 to 20 picofarads
Inductors 43, 49, 55 and 61—50 mil. dia. 2/10 inch long straight wire 2±15% nanohenries
Inductors 41, 47, 53 and 59—30 mil. dia. 6/10 inch long straight wire 10± 15% nanohenries
Inductor 73—0.1 microhenry
Inductor 81—8 nanohenries

What is claimed is:

1. An amplifier comprising:

a plurality of active devices each having an input electrode, an output electrode, and a common electrode, said devices having inherently different input impedances providing unequal current and voltage distribution in said devices and consequently unequal power dissipation in said devices upon the application of an input signal of a given frequency to said input electrodes, means connecting said common electrodes together and to a point of reference potential, means connecting said output electrodes to a common load, a plurality of T-section networks each comprising series connected reactances of one type and a reactance of another type coupled between the junction of said series connected reactances and said point of reference potential, means to supply said input signals to said plurality of networks, and means connecting each of said networks individually between said signal supply means and one of said input electrodes to form a plurality of sperate parallel paths each having a T-section network connected between said signal supply means and the input electrode of said device in that path.

2. The combination as claimed in claim 1 wherein in each of said networks the value of said reactance of another type and the value of said series connected reactance between the junction of said reactance of another type and said input electrode are approximately equal at said given frequency.

3. The combination as claimed in claim 1 wherein in each of said networks the value of said series reactance between the junction of said reactance of another type and said signal supply means is sufficient to provide in combination with the remaining series connected reactance in said network isolation of said devices one from another and to minimize the effect of inherent input impedance differences therebetween.

4. The combination as claimed in claim 1 wherein said series connected reactances are inductors and said reactance of another type is a capacitance.

5. The combination as claimed in claim 1 wherein said active devices are transistors connected in common emitter configuration.

6. The combination as claimed in claim 1 wherein said series connected reactances are two inductors the values of which are unequal.

References Cited

UNITED STATES PATENTS 3,022,465 2/1962 Slenker et al. ---------- 330—30

FOREIGN PATENTS 1,160,238 7/1958 France.

ROY LAKE, Primary Examiner

L. J. DAHL, Assistant Examiner

U.S. Cl. X.R.

330—31